(12) United States Patent
Bertsche

(10) Patent No.: US 7,394,069 B1
(45) Date of Patent: Jul. 1, 2008

(54) LARGE-FIELD SCANNING OF CHARGED PARTICLES

(75) Inventor: Kirk J. Bertsche, San Jose, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 315 days.

(21) Appl. No.: 11/280,829

(22) Filed: Nov. 15, 2005

Related U.S. Application Data

(60) Provisional application No. 60/712,694, filed on Aug. 30, 2005.

(51) Int. Cl.
*G21K 1/00* (2006.01)
(52) U.S. Cl. .................. 250/310; 250/306; 250/307; 250/308; 250/396 R; 250/492.2; 382/145
(58) Field of Classification Search ............... 250/306, 250/307, 308, 309, 310, 396 R, 492.2; 382/145
See application file for complete search history.

(56) References Cited

U.S. PATENT DOCUMENTS

| 4,789,787 A * | 12/1988 | Parker ................. 250/396 ML |
| 4,962,313 A | 10/1990 | Rose |
| 5,084,622 A | 1/1992 | Rose |
| 5,126,565 A | 6/1992 | Rose |
| 5,319,207 A | 6/1994 | Rose et al. |
| 5,336,885 A | 8/1994 | Rose et al. |
| 5,448,063 A | 9/1995 | De Jong et al. |
| 5,449,914 A | 9/1995 | Rose et al. |
| 5,502,306 A | 3/1996 | Meisburger et al. |
| 5,831,274 A * | 11/1998 | Nakasuji ............... 250/492.23 |
| 6,559,445 B2 | 5/2003 | Rose |
| 6,586,736 B1 * | 7/2003 | McCord .................... 250/310 |
| 6,618,134 B2 | 9/2003 | Vaez-Iravani et al. |
| 6,633,366 B2 | 10/2003 | de Jager et al. |
| 6,636,302 B2 | 10/2003 | Nikoonahad et al. |
| 6,673,637 B2 | 1/2004 | Wack et al. |
| 6,774,372 B1 | 8/2004 | Rose et al. |
| 6,784,437 B2 | 8/2004 | Rose |
| 6,797,962 B1 | 9/2004 | Rose et al. |
| 6,836,372 B2 | 12/2004 | Rose et al. |
| 6,878,936 B2 * | 4/2005 | Kienzle et al. ............... 250/310 |
| 6,891,168 B2 * | 5/2005 | Knippelmeyer ......... 250/396 R |
| 6,914,248 B2 * | 7/2005 | Clauss ................. 250/396 ML |
| 6,943,349 B2 * | 9/2005 | Adamec et al. ............. 250/310 |
| 6,967,328 B2 * | 11/2005 | Kienzle et al. ............... 250/310 |
| 2002/0130260 A1 * | 9/2002 | McCord et al. ............. 250/306 |
| 2003/0066961 A1 * | 4/2003 | Kienzle et al. ............... 250/306 |

(Continued)

OTHER PUBLICATIONS

Stan Stokowski, et al. "Wafer inspection technology challenges for ULSI manufacturing", 11 sheets, KLA-Tencor, Milpitas, California.

*Primary Examiner*—Jack I. Berman
*Assistant Examiner*—Michael J Logie
(74) *Attorney, Agent, or Firm*—Okamoto & Benedicto LLP

(57) ABSTRACT

One embodiment relates to a charged-particle beam apparatus. The apparatus includes at least a source for generating the charged-particle beam, a first deflector, and a second deflector. The first deflector is configured to scan the charged-particle beam in a first dimension. The second deflector is configured to deflect the scanned beam such that the scanned beam impinges telecentrically (perpendicularly) upon a surface of a target substrate. Other embodiments are also disclosed.

20 Claims, 7 Drawing Sheets

U.S. PATENT DOCUMENTS

2003/0169060 A1* 9/2003 Shinada et al. .............. 324/751
2004/0056193 A1* 3/2004 Kienzle et al. .............. 250/306
2005/0035292 A1* 2/2005 Adamec et al. .............. 250/310
2006/0060790 A1* 3/2006 Nakasuji et al. .......... 250/423 F

* cited by examiner

FIG. 6          600

Plan View

LARGE-FIELD SCANNING OF CHARGED PARTICLES

CROSS-REFERENCE TO RELATED APPLICATION

The present application claims the benefit of U.S. Provisional Application No. 60/712,694, entitled "Large-Field Scanning of Charged Particles," filed Aug. 30, 2005, by inventor Kirk J. Bertsche, the disclosure of which is hereby incorporated by reference.

BACKGROUND OF THE INVENTION

1. Field of the Invention

The present invention relates generally to charged-particle beam apparatus.

2. Description of the Background Art

Charged-particle beam apparatus utilize particles such as electrons, protons or ions. Such apparatus include, for example, scanning electron microscopes (SEMs), electron beam inspection/review tools, electron beam metrology tools, and various other apparatus.

SUMMARY

One embodiment relates to a charged-particle beam apparatus. The apparatus includes at least a source for generating the charged-particle beam, a first deflector, and a second deflector. The first deflector is configured to scan the charged-particle beam in a first dimension. The second deflector is configured to deflect the scanned beam such that the scanned beam impinges telecentrically (perpendicularly) upon a surface of a target substrate.

Another embodiment relates to a method of electron beam inspection. A primary electron beam is generated and scanned in a first dimension. The scanned beam is deflected such that it impinges telecentrically upon a surface of a target substrate.

Another embodiment relates to a method of electron beam lithography. A primary electron beam is generated and scanned in a first dimension. The scanned beam is controllably blocked so as to generate a programmed pattern. The scanned beam is also deflected such that it impinges telecentrically upon a surface of a target substrate.

Other embodiments are also disclosed.

DETAILED DESCRIPTION

For some applications, it is desirable to scan a charged-particle beam over a large distance in at least one dimension. This may be done with a relatively large working distance (similar to the scan size) between deflectors and target, as in a typical cathode ray tube (CRT). An example of such a configuration is shown in FIG. 1.

Figure 1:
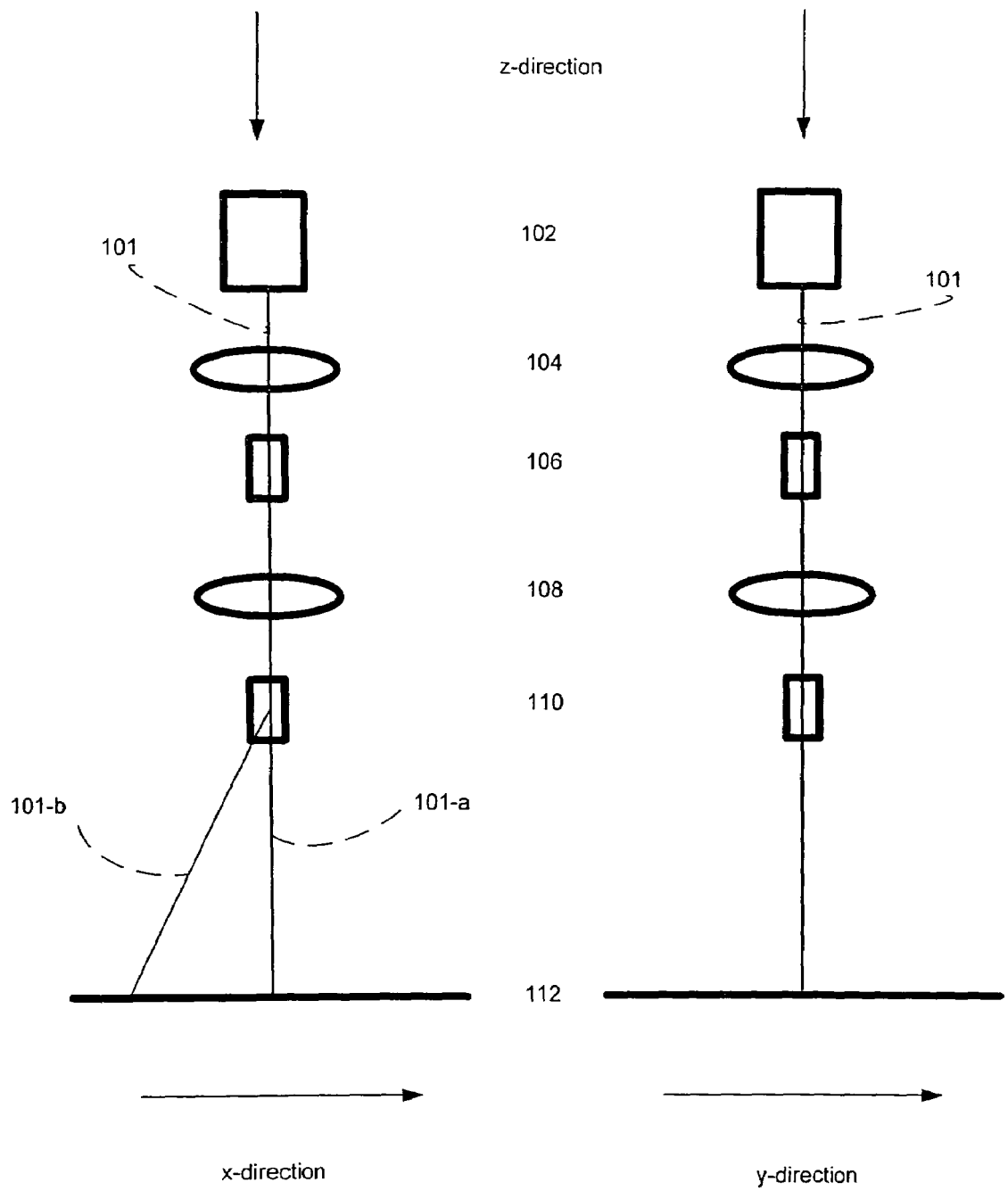
FIG. 1 is a schematic diagram depicting an apparatus which deflects a charged-particle beam over a large distance.

FIG. 1 is a schematic diagram depicting an apparatus 100 which deflects a charged-particle beam over a large distance. The left side of FIG. 1 is a cross-section showing the xz-plane of the column, while the right side of FIG. 1 is a cross-section showing the yz-plane of the column. The optic axis of the column lies along the z-direction. The components shown in FIG. 1 are generally in a vacuum environment within a column structure. The apparatus 100 may include other well-known components which are not discussed below.

A primary or incident electron beam 101 is generated using an electron gun (or other type of electron source) 102 and gun lenses 104. Other column components 106 may include, for example, blanker, aperture, DC align, and DC and dynamic stigmator components. A main lens 108 may then focus the beam 101, and the beam 101 may be deflected across a large angular range using a scan deflector 110. The scan deflector 110 may be implemented as an electrostatic deflector in one embodiment, or may be implemented as a magnetic deflector in another embodiment.

In the configuration shown in FIG. 1, the scan deflector 110 scans the beam 101 along the x-direction. Depicted on the left side of FIG. 1 are two example trajectories: the beam as undeflected 101-a and going straight down the optic axis of the column; and the beam as deflected 101-b at an angle in the negative x-direction. The scanned beam 101 impinges upon a substrate surface 114.

However, the apparatus 100 of FIG. 1 has the drawback and disadvantage in that the beam 101 of charged particles does not land perpendicularly onto the surface of the target substrate 112. In other words, the configuration of FIG. 1 is not "telecentric." This non-perpendicular (non-telecentric) landing is visible, for example, in the trajectory 101-b of the beam when it is deflected far from the optical axis of the column. With this condition, topography of the target will cause shadowing which is dependent on scan position, and there may also be variations in the yield of scattered electrons. A second disadvantage is that with the large working distance, electric fields at the target substrate cannot be varied over a large range.

Furthermore, the scattered electrons (secondary electrons and/or backscattered electrons) in such a system tend to spread over a large area. This makes the scattered electron detection system (not shown) complex and large. The complex and large detection system may typically limit the detection speed and the possibilities for energy or spatial resolution.

Therefore, it is highly desirable to improve the scanning of charged-particle beams over large fields. In particular, it is highly desirable to overcome the above discussed drawbacks and limitations.

The present application discloses techniques to substantially improve large-field scanning of charged particles. Depending on the particular application, one or more of these techniques may be combined together.

Figure 2:
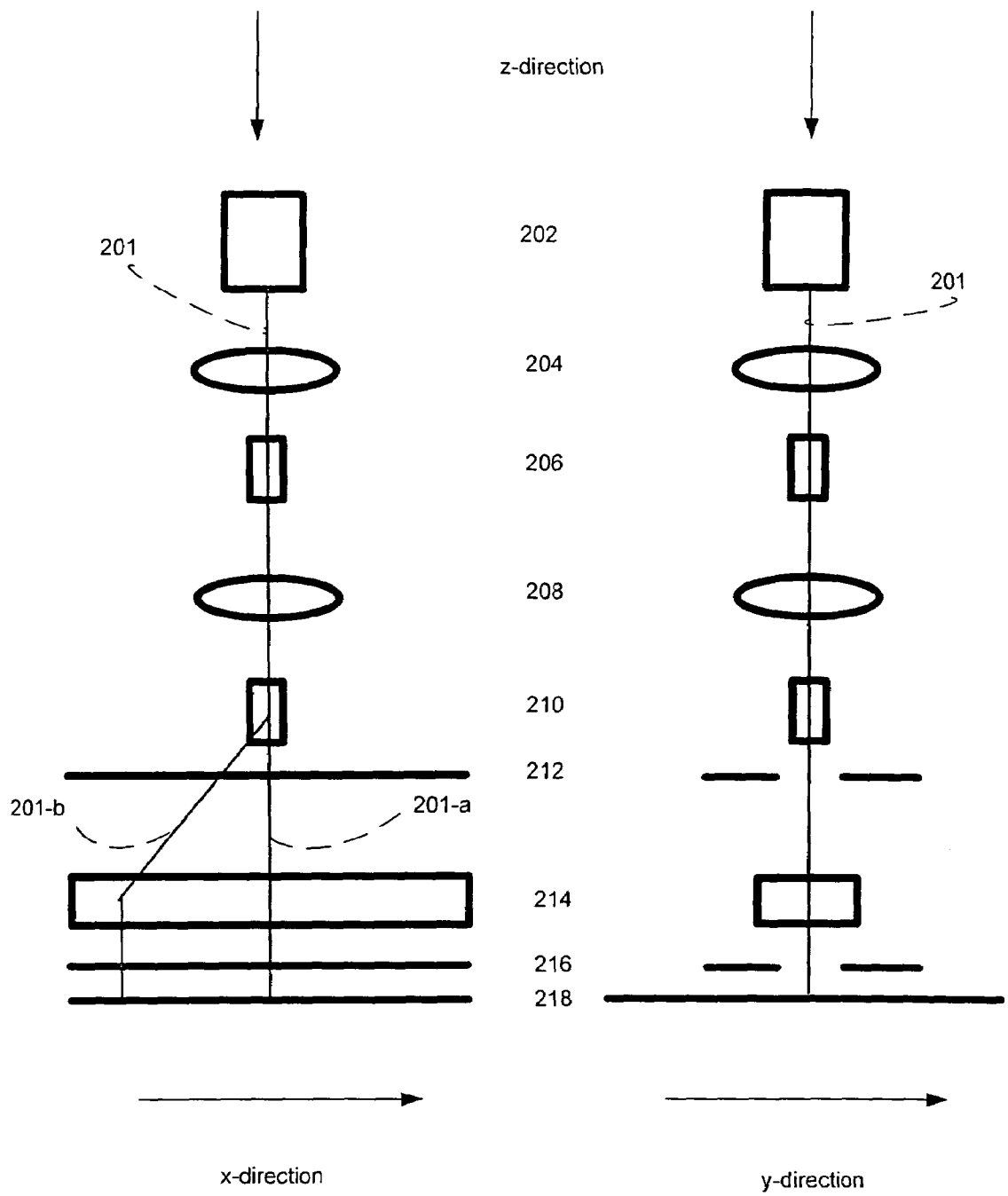
FIG. 2 is a schematic diagram depicting an apparatus which deflects a charged-particle beam over a large distance in a telecentric manner in accordance with an embodiment of the invention.

FIG. 2 is a schematic diagram depicting an apparatus which deflects a charged-particle beam over a large distance in a telecentric manner in accordance with an embodiment of the invention. The left side of FIG. 2 is a cross-section showing the xz-plane of the column, while the right side of FIG. 2 is a cross-section showing the yz-plane of the column. The optic axis of the column lies along the z-direction. The components shown in FIG. 2 are generally in a vacuum environment within a column structure. The apparatus 200 may include other well-known components which are not discussed below.

A primary or incident electron beam 201 is generated using an electron gun (or other type of electron source) 202 and gun lenses 204. Other column components 206 may include, for example, blanker, aperture, DC align, and DC and dynamic stigmator components. A main lens 208 may then focus the beam 201, and the beam 201 may be deflected across a large angular range using a scan deflector 210. The scan deflector 210 may be implemented as an electrostatic deflector in one embodiment, or may be implemented as a magnetic deflector in another embodiment.

In the configuration shown in FIG. 2, the scan deflector 210 scans the beam 201 along the x-direction. Depicted on the left side of FIG. 2 are two example trajectories: the beam as undeflected 201-a and going straight down the optic axis of the column; and the beam as deflected 201-b at an angle in the negative x-direction.

In this apparatus 200, the scanned beam 201 passes through a slot along the x-direction in a collector plate of the secondary electron detector 212. The detector 212 is thus configured to allow the beam 201 to be scanned along one-dimension while also functioning to collect secondary electrons emitted from the substrate 218.

The beam 201 is then deflected for a second time by a linear deflector. Here, the linear deflector comprises a magnetic scanner 214. The magnetic scanner 214 is configured so as not to deflect the undeflected beam 201-a traveling along the optic axis of the column. The greater the angle of the deflected beam 201-b, the greater the second deflection by the magnetic scanner 214 so as to re-orient the beam perpendicularly with respect to the surface of the substrate 218.

In one embodiment, the magnetic scanner 214 may be comprised of two long coils, with or without pole pieces. The magnetic field from the magnetic scanner 214 is oriented in the short direction (i.e. across the slot). If pole pieces are used, they are preferably laminated rather than solid to avoid eddy currents.

Electric field strength at the surface of the substrate 218 may be controlled by a Wehnelt electrode 216. The Wehnelt electrode 216 comprises a long slotted charge-control electrode which is a short distance above the surface of the substrate 218. The Wehnelt electrode 216 provides for control over the electric fields at the substrate surface while allowing a large scan in one dimension. The Wehnelt electrode 216 also provides for the option of one-dimensional focusing of the secondary electrons emitted from the substrate 218.

In accordance with an alternate embodiment, the apparatus may be configured without the detector 212, such that the scattered electrons may instead be collected at a combined Wehnelt electrode/detector assembly at 216. In another alternate embodiment, such a detector may be omitted altogether, and the substrate current may instead be used to provide a signal for forming an image of the substrate.

Figure 3:
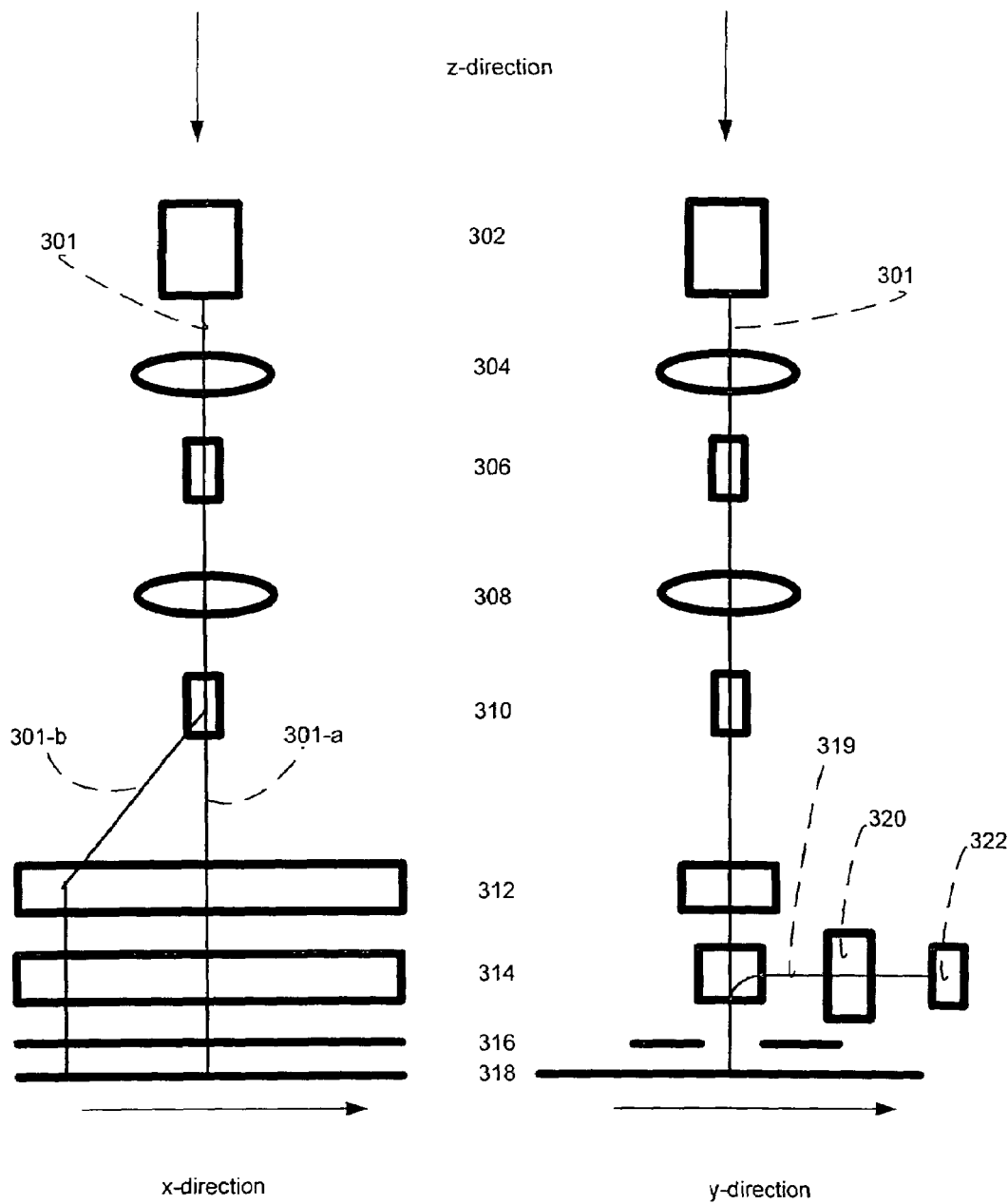
FIG. 3 is a schematic diagram depicting an apparatus which deflects a charged-particle beam over a large distance in a telecentric manner in accordance with another embodiment of the invention.

FIG. 3 is a schematic diagram depicting an apparatus 300 which deflects a charged-particle beam over a large distance in a telecentric manner in accordance with another embodiment of the invention. The left side of FIG. 3 is a cross-section showing the xz-plane of the column, while the right side of FIG. 3 is a cross-section showing the yz-plane of the column. The optic axis of the column lies along the z-direction. The components shown in FIG. 3 are generally in a vacuum environment within a column structure. The apparatus 300 may include other well-known components which are not discussed below.

A primary or incident electron beam 301 is generated using an electron gun (or other type of electron source) 302 and gun lenses 304. Other column components 306 may include, for example, blanker, aperture, DC align, and DC stigmator components. A main lens 308 may then focus the beam 301, and the beam 301 may be deflected across a large angular range using a scan deflector 310. The scan deflector 310 may be implemented as an electrostatic deflector in one embodiment, or may be implemented as a magnetic deflector in another embodiment.

In the configuration shown in FIG. 3, the scan deflector 310 scans the beam 301 along the x-direction. Depicted on the left side of FIG. 3 are two example trajectories: the beam as undeflected 301-a and going straight down the optic axis of the column; and the beam as deflected 301-b at an angle in the negative x-direction.

In this apparatus 300, the scanned beam 301 is deflected for a second time by a linear deflector 312. Here, the linear deflector 312 comprises a magnetic scanner or an electric comb deflector. The linear deflector 312 is configured or operated so as not to deflect the undeflected beam 301-a traveling along the optic axis of the column. The greater the angle of the deflected beam 301-b, the greater the second deflection by the linear deflector 312 so as to re-orient the beam perpendicularly with respect to the surface of the substrate 318.

In one embodiment, the linear deflector 312 may be implemented as a magnetic scanner comprised of two long coils, with or without pole pieces. The magnetic field from the magnetic scanner is oriented in the short direction (i.e. along the y-direction). If pole pieces are used, they are preferably laminated rather than solid to avoid eddy currents. In another embodiment, the linear deflector 312 may be implemented as an electric comb deflector. Such an electric comb deflector is described further below in relation to FIG. 7.

After the second deflection, the beam 301 may pass through an electric secondary electron (SE) separator 314. The SE separator 314 is configured to separate secondary electrons 319 emitted from the surface, such that the secondary electrons 319 are directed away from the primary beam 301 and towards the secondary electron detection system. The SE separator 314 separates the secondary electrons 319 from the primary beam 301 before the secondary electrons 319 reach the linear deflector 312. Such separation is particularly advantageous if the linear deflector 312 comprises a magnetic scanner because otherwise the secondary electrons 319 may be deflected in a wrong direction by the magnetic scanner. An implementation of the SE separator 314 is discussed further below in relation to FIG. 4.

Electric field strength at the surface of the substrate 318 may be controlled by a Wehnelt electrode 316. The Wehnelt electrode 316 may comprise a long slotted charge-control electrode which is a short distance above the surface of the substrate 318. The Wehnelt electrode 316 provides for control over the electric fields at the substrate surface while allowing a large scan in one dimension. A positive potential may be applied to the Wehnelt electrode 316 with respect to the substrate 318 so as to accelerate the secondary electrons 319 away from the substrate. The Wehnelt electrode 316 may also provide one-dimensional focusing (in the y-dimension) of the secondary electrons 319 emitted from the substrate 318.

Furthermore, an additional electrode or electrodes (not depicted) may be positioned further from the substrate 318 than the Wehnelt electrode 316. The additional electrode(s)

may have a positive potential with respect to the substrate and may be used for better control of fields at the substrate surface than the use of the Wehnelt electrode 316 alone. For example, a "saddle field" may be formed, giving no electric field at the substrate surface directly under the slot, but with an approximately linearly increasing field strength as distance increases from the substrate surface.

The secondary electron detection system may include, for example, a de-scanner 320 and a detector 322. The de-scanner 320 may be configured to deflect the secondary electrons along the x-direction in such a way that the secondary electrons converge upon the position of the detector 322. Alternatively, the secondary electron detection system may comprise an array detector which includes a series of detector elements along the x-direction so as to detect the secondary electrons without necessarily needing the de-scanner 320.

Figure 4:
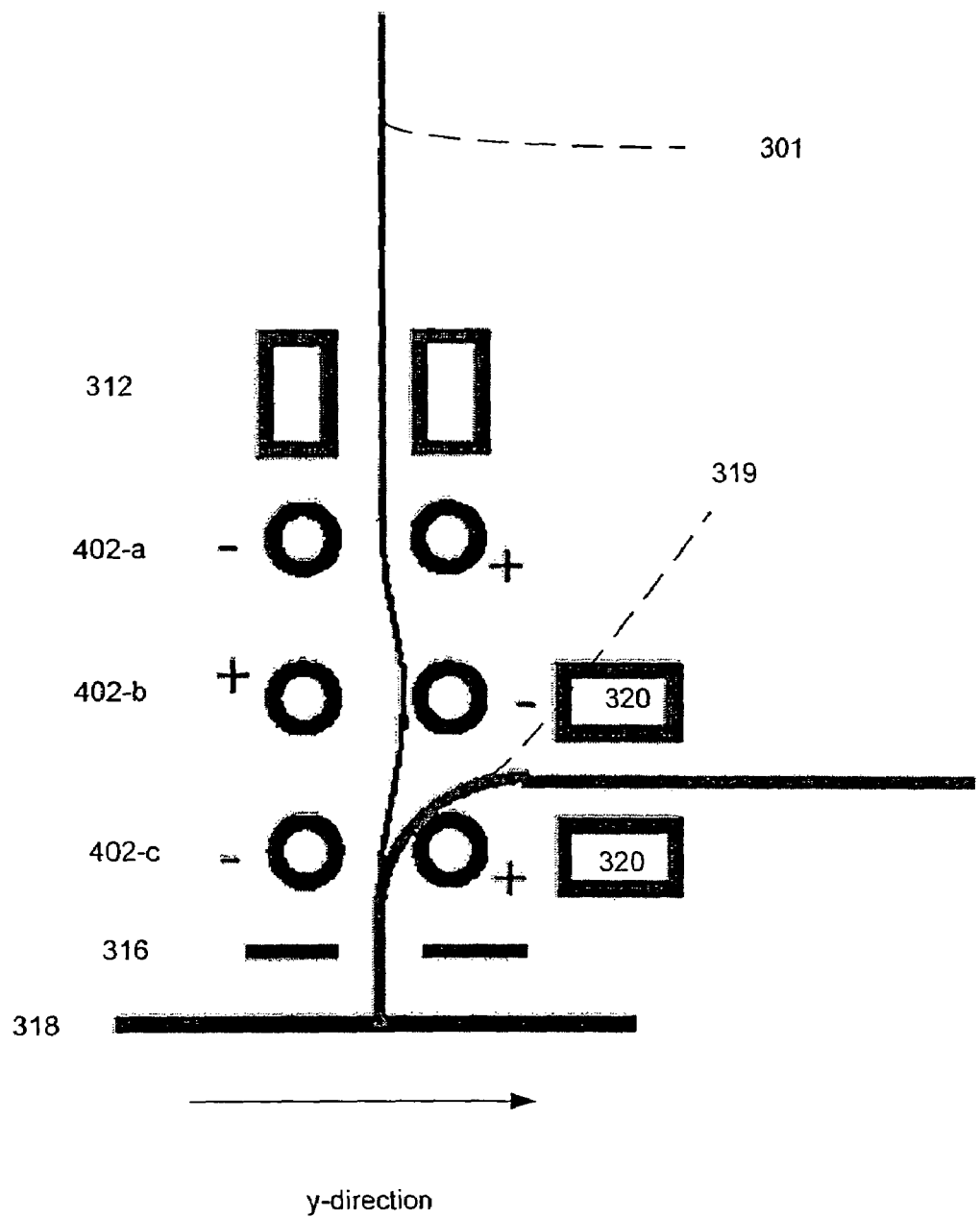
FIG. 4 is a detailed view including an implementation of the secondary electron separator.

FIG. 4 is a detailed view including an implementation of the secondary electron separator 314. Here, the separator 314 is shown as implemented as an electric separator including three pairs of electrodes 402-*a*, 402-*b*, and 402-*c*, the electrodes being oriented lengthwise in the x-direction.

The first pair of electrode 402-*a* is shown with a negatively-charged (relatively negative potential) left electrode and a positively-charged (relatively positive potential) right electrode. The second pair of electrode 402-*b* is shown with a positively-charged (relatively positive potential) left electrode and a negatively-charged (relatively negative potential) right electrode. The third pair of electrode 402-*c* is shown with a negatively-charged (relatively negative potential) left electrode and a positively-charged (relatively positive potential) right electrode.

Preferably, the potentials on the electrodes are adjusted so that the primary electron beam 301 (which is of higher energy) is only slightly deflected and impacts perpendicularly upon the surface of the substrate 318. However, because the secondary electrons 319 are emitted in the reverse direction at much lower energies, the secondary electrons 319 are substantially deflected by the separator 314 such that their trajectories are bent away from the optic axis and towards the detection system. In the particular implementation illustrated in FIG. 4, the secondary electrons 319 may be deflected between the second 402-*b* and third 402-*c* electrode pairs such that they travel into the de-scanner device 320.

Figure 5:
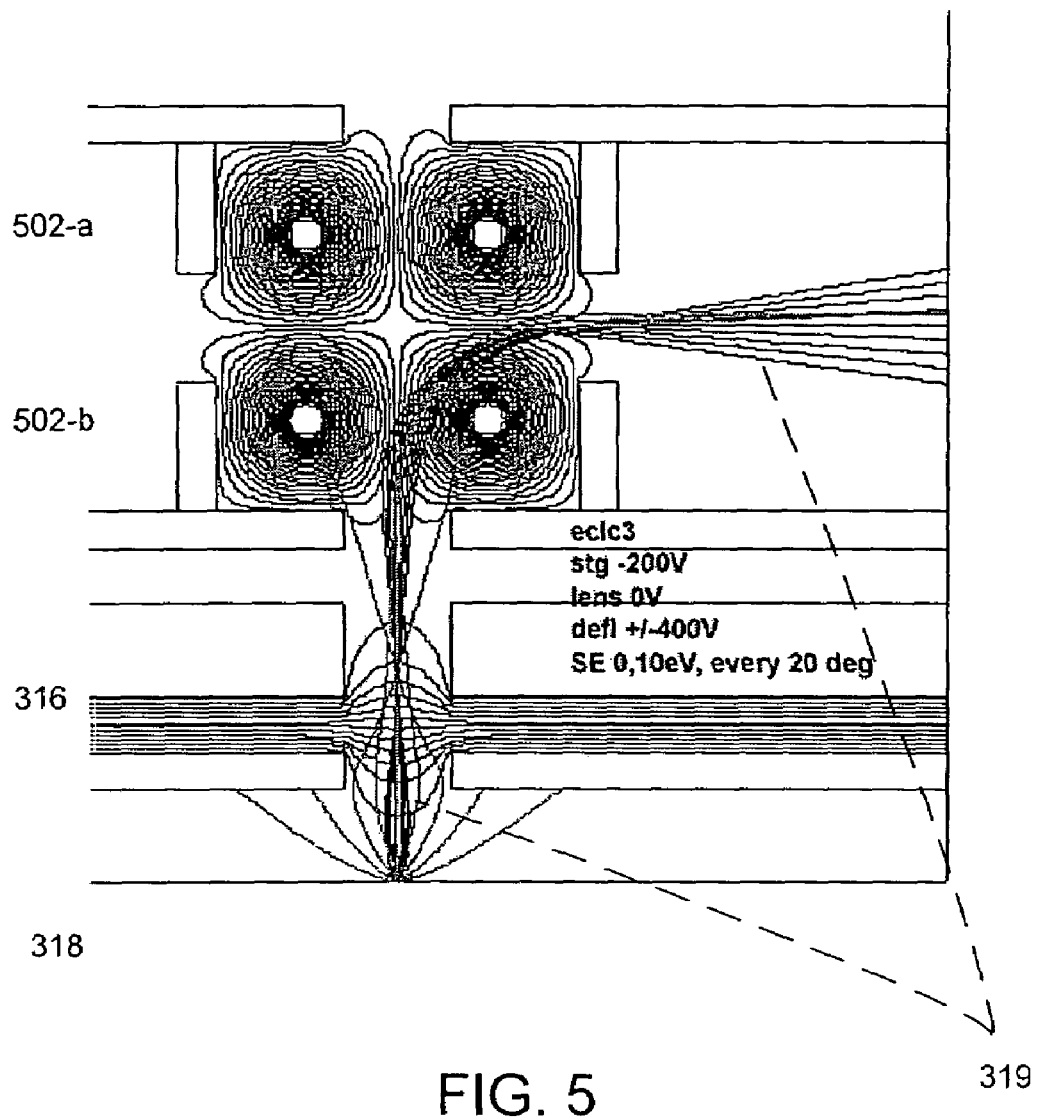
FIG. 5 shows simulated electric fields and secondary electron trajectories in an electric separator.

FIG. 5 shows simulated electric fields and secondary electron trajectories in an electric separator. The simulated separator of FIG. 5 includes two pairs of electrodes 502-*a* and 502-*b*. Secondary electrons 319 emitted from the surface of the substrate 318 travel through a slotted Wehnelt 316 and to the bottom pair of electrodes 502-*b*. The trajectories of the secondary electrons 319 are deflected (bent) so that the secondary electrons 319 leave the optic axis of the column and are directed to between the right electrode of the bottom pair 502-*b* and the right electrode of the top pair 502-*a*. This simulation shows that the secondary electron beam separator 314 of FIG. 3 may be successfully configured.

Figure 6:
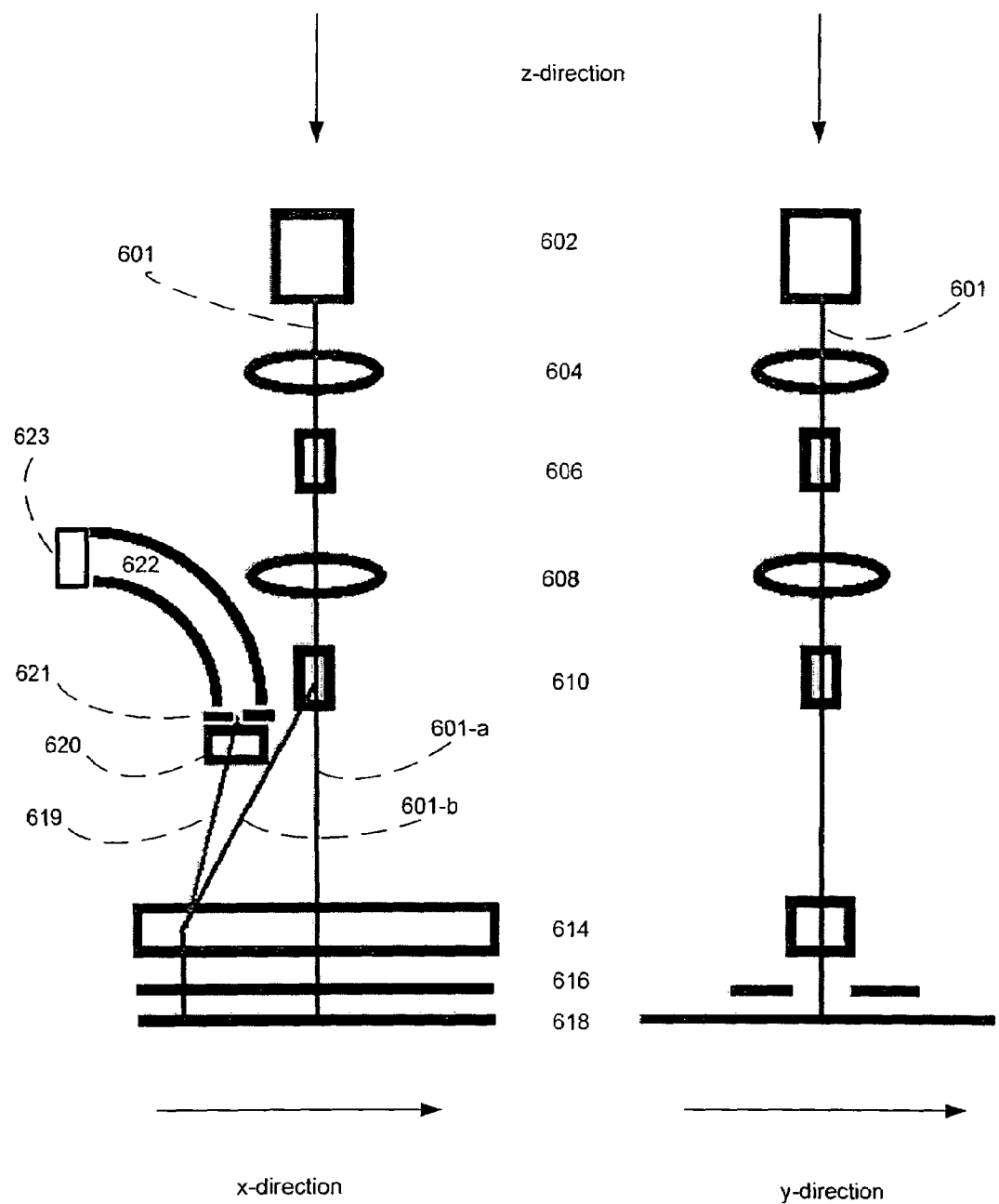
FIG. 6 is a schematic diagram depicting an apparatus which utilizes both a static magnetic field and an electric deflector in accordance with another embodiment of the invention.

FIG. 6 is a schematic diagram depicting an apparatus which utilizes both a static magnetic field and an electric deflector in accordance with another embodiment of the invention. The left side of FIG. 6 is a cross-section showing the xz-plane of the column, while the right side of FIG. 6 is a cross-section showing the yz-plane of the column. The optic axis of the column lies along the z-direction. The components shown in FIG. 6 are generally in a vacuum environment within a column structure. The apparatus 600 may include other well-known components which are not discussed below.

A primary or incident electron beam 601 is generated using an electron gun (or other type of electron source) 602 and gun lenses 604. Other column components 606 may include, for example, blanker, aperture, DC align, and DC and dynamic stigmator components. A main lens 608 may then focus the beam 601, and the beam 601 may be deflected across a large angular range using a scan deflector 610. The scan deflector 610 may be implemented as an electrostatic deflector in one embodiment, or may be implemented as a magnetic deflector in another embodiment.

In the configuration shown in FIG. 6, the scan deflector 610 scans the beam 601 along the x-direction. Depicted on the left side of FIG. 6 are two example trajectories: the beam as undeflected 601-*a* and going straight down the optic axis of the column; and the beam as deflected 601-*b* at an angle in the negative x-direction.

The scanned beam 601 is then deflected for a second time by an elongated Wien filter 614. The elongated Wien filter 614 comprises an electric "comb" deflector, where the electric field is along the slot direction (i.e. along the x-direction), combined with a static magnetic deflector, where the magnetic field is across the slot direction (i.e. along the y-direction). The electric comb deflector is configured or operated so as not to deflect the undeflected beam 601-*a* traveling along the optic axis of the column. The greater the angle of the deflected beam 601-*b*, the greater the second deflection by the electric comb deflector so as to re-orient the beam perpendicularly with respect to the surface of the substrate 618.

Electric field strength at the surface of the substrate 618 may be controlled by a Wehnelt electrode 616. The Wehnelt electrode 616 may comprise a long slotted charge-control electrode which is a short distance above the surface of the substrate 618. The Wehnelt electrode 616 provides for control over the electric fields at the substrate surface while allowing a large scan in one dimension. A positive potential may be applied to the Wehnelt electrode 616 with respect to the substrate 618 so as to accelerate the secondary electrons 619 away from the substrate. The Wehnelt electrode 616 may also provide one-dimensional focusing (in the y-dimension) of the secondary electrons 619 emitted from the substrate 618.

Furthermore, an additional electrode or electrodes (not depicted) may be positioned further from the substrate 618 than the Wehnelt electrode 616. The additional electrode(s) may have a positive potential with respect to the substrate and may be used for better control of fields at the substrate surface than the use of the Wehnelt electrode 616 alone. For example, a "saddle field" may be formed, giving no electric field at the substrate surface directly under the slot, but with an approximately linearly increasing field strength as distance increases from the substrate surface.

The elongated Wien filter 614 may be configured to deflect the secondary electrons 619 so as to effectively de-scan their positions such that the secondary electrons 619 converge at a point which is offset along the slot dimension from the electron source. In other words, the Wien filter 614 may de-scan the secondary electrons such that they enter a fixed detection system.

As illustrated in FIG. 6, the detection system may comprise a de-scanner 620, an entry slot 621, an energy analyzer 622, and a segmented detector 623. The de-scanner 620 may be configured to deflect the secondary electrons 619 so that they enter the entry slot 621 at a uniform position and/or angle. The energy analyzer 622 receives the secondary electrons passing through the entry slot 621. The energy analyzer 622 may be configured to disperse the electrons with an electric or magnetic field so that their position is dependent on their energy. A segmented detector (or a detector array) 623 may receive the dispersed electrons so as to provide an energy spectrum of the detected secondary electrons.

Figure 7:
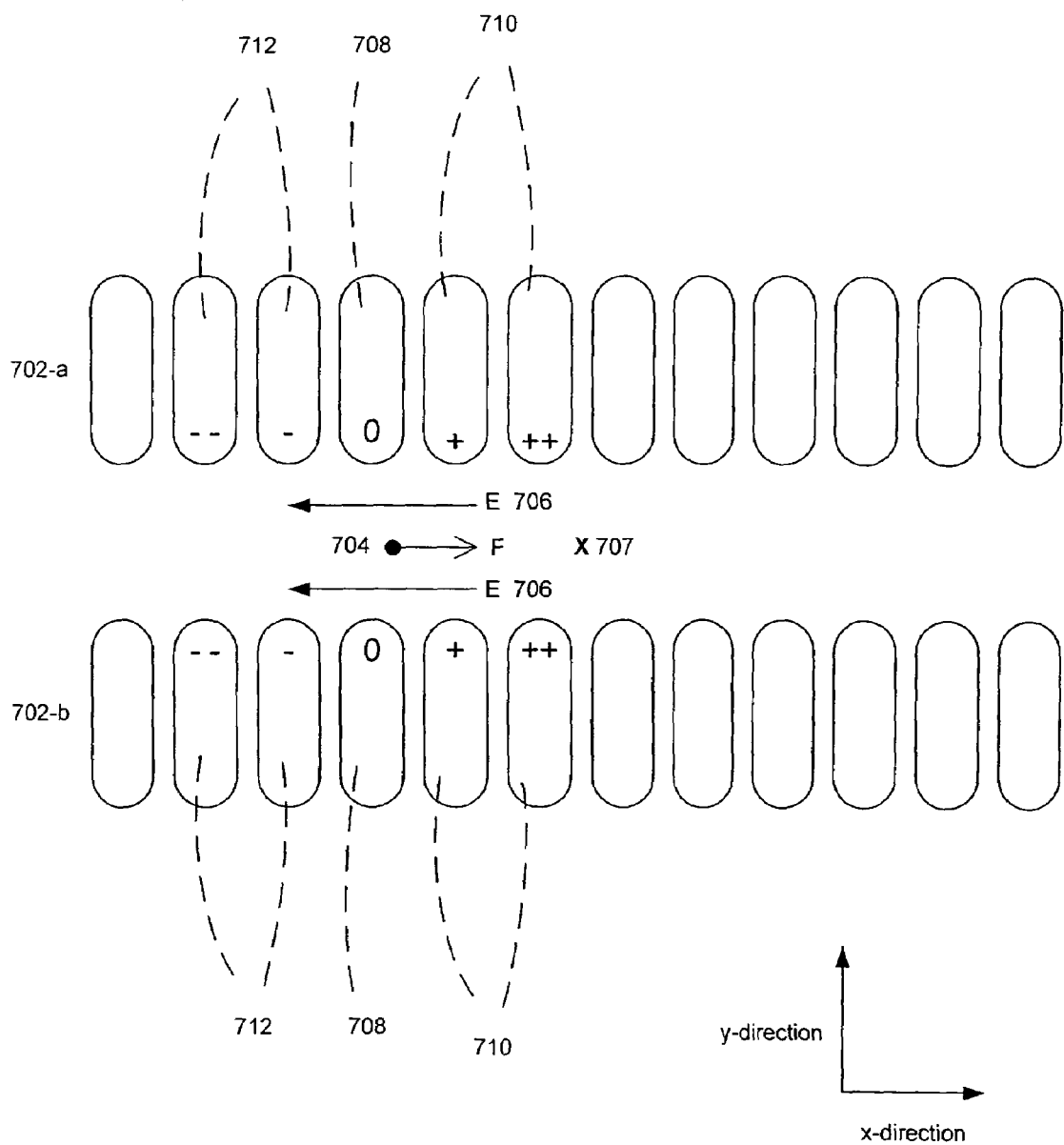
FIG. 7 is a schematic diagram depicting an electric comb deflector in accordance with an embodiment of the invention.

FIG. 7 is a schematic diagram depicting an electric comb deflector 700 in accordance with an embodiment of the invention. The electric comb deflector 700 is shown in plan view (the view in the xy plane of FIG. 3, for example). The electric comb deflector 700 includes two rows of electrodes 702-*a* and 702-*b*. A position in the plane of the primary electron beam 704 is shown in between the two rows of electrodes 702-*a* and 702-*b*.

Electric charges may be controllably applied to the electrodes in each row such that dipole electric fields E 706 are in the vicinity of the primary electron beam 704. As shown, the general idea is to have the electrodes 708 nearest to the electron beam position 704 to have a neutral (or near neutral) charge, the electrodes 710 on the side towards the optic axis ("X") 707 in relation to the electron beam position 704 to be positively charged, and the electrodes 712 on the side away from the optic axis 707 in relation to the electron beam position 704 be negatively charged. This results in an electric field E 706 pointed away from the optic axis 707 and in the application of electrostatic force F which bends the trajectory of the negatively-charged electron beam 704.

As the electron beam 704 is scanned to and from along the x-dimension, the charges on the electrodes 702-*a* and 702-*b* are adjusted in position and strength so as to bend the electron beam 704 by an appropriate amount. In other words, the electrostatic potentials applied to the electrodes 702 are scanned with the beam 704. Preferably, the applied potentials are of a strength so as to achieve telecentric impingement of the electron beam 704 onto the substrate. Of course, when the electron beam 704 is positioned at the optic axis 707, no deflection is needed. In the absence of a magnetic field, no electric field E 706 need by generated by the electric comb deflector 700 at this position. If the electric comb deflector 700 is part of an elongated Wien filter (as in FIG. 6), the field E 706 generated by the electric comb deflector 700 at this position will create a force on the electron beam 704 equal and opposite to the magnetic force, so that the electron beam 704 has no net deflection.

Alternatively, in some situations, it may be possible for the electric comb deflector's electrostatic potentials to be static. For example, a quasi-parabolic potential profile may be applied along the slot dimension (the x-dimension).

The above-discussed techniques may be used with a single electron source, or with a linear array of sources. For a linear array of sources, it is preferable to deflect the charged-particle beams from all the sources simultaneously and to detect secondary electrons on separate detectors corresponding to the sources.

If a smaller spot size of the primary beam is needed in the above-discussed systems, lenses elongated in the slot dimension may be used to provide additional focusing. These can be of the electric "comb lens" or the magnetic "slider lens" variety. A magnetic "slider lens" is described, for example, in U.S. Pat. No. 6,633,366 to de Jager et al.

Possible applications for the above-discussed techniques include, for example, electron beam inspection and electron beam lithography.

In the case of electron beam inspection, the secondary electrons, the backscattered electrons, and/or the substrate current may be used as the detected signal. The wafers or other substrates being inspected may be translated in a direction perpendicular to the linear scan provided by the above-described apparatus. In other words, if the scan is along the x-dimension, the wafers or other substrates may be translated along the y-dimension.

In the case of electron beam lithography, detection of the secondary electrons is not needed. The primary electron beam may be controllably blocked so as to generate a programmed pattern.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. A charged-particle beam apparatus, the apparatus comprising:
    at least one source for generating a charged-particle beam;
    a first deflector configured to scan the charged-particle beam in a first dimension; and
    a second deflector configured to deflect the scanned beam such that the scanned beam impinges telecentrically upon a surface of a target substrate,
    wherein the second deflector comprises a Wien filter elongated and oriented lengthwise along the first dimension, and
    wherein the elongated Wien filter comprises an electric comb deflector applying an electric field along the first dimension and a static magnetic deflector applying a magnetic field perpendicular to the first dimension.

2. The apparatus of claim 1, further comprising a beam separator configured to deflect secondary electrons emitted from the target substrate towards a detector system.

3. The apparatus of claim 2, wherein the beam separator comprises pairs of electrodes oriented lengthwise along the first dimension.

4. The apparatus of claim 2, further comprising a de-scanner to further deflect the secondary electrons such that the secondary electrons converge upon a detector.

5. The apparatus of claim 1, further comprising a Wehnelt electrode configured to control charge at the surface of the target substrate, the Wehnelt electrode including a slot oriented lengthwise along the first dimension.

6. The apparatus of claim 5, further comprising an additional electrode positioned further away from the surface of the target substrate than the Wehnelt electrode, the electrode having a positive potential with respect to the target substrate.

7. The apparatus of claim 1, wherein the elongated Wien filter is configured to deflect secondary electrons emitted from the target substrate so as the secondary electrons converge at a position of a detection system.

8. The apparatus of claim 1, wherein the detection system comprises an energy analyzer.

9. The apparatus of claim 1, further comprising an array of multiple sources for generating charged-particle beams.

10. The apparatus of claim 9, wherein the charged-particle beams from the multiple sources are deflected simultaneously such that each beam impinges telecentrically upon the surface of the target substrate.

11. The apparatus of claim 1, further comprising circuitry to detect a substrate current.

12. The apparatus of claim 11, wherein the detected substrate current is used to provide a signal for forming an image of the target substrate.

13. A method of electron beam inspection, the method comprising:
   generating a primary electron beam;
   scanning the primary electron beam in a first dimension; and
   deflecting the scanned beam such that the scanned beam impinges telecentrically upon a surface of a target substrate,
   wherein said deflecting is performed using a Wien filter elongated and oriented lengthwise along the first dimension, and
   wherein the elongated Wien filter comprises an electric comb deflector applying an electric field along the first dimension and a static magnetic deflector applying a magnetic field perpendicular to the first dimension.

14. The method of claim 13, further comprising separating secondary electrons emitted from the target substrate from the primary electron beam by deflecting the secondary electrons towards a detector system.

15. The method of claim 14, wherein said separating is performed using pairs of electrodes oriented lengthwise along the first dimension.

16. The method of claim 13, further comprising controlling charge at the surface of the target substrate using a Wehnelt electrode, said Wehnelt electrode including a slot oriented lengthwise along the first dimension.

17. The method of claim 13, wherein the elongated Wien filter deflects secondary electrons emitted from the target substrate so that the secondary electrons converge at a position of a detection system.

18. The method of claim 17, further comprising generating an energy spectrum of the secondary electrons.

19. The method of claim 13, wherein the target substrate is translated in a direction perpendicular to the first dimension.

20. A method of electron beam lithography, the method comprising:
   generating a primary electron beam;
   scanning the primary electron beam in a first dimension;
   controllably blocking the primary electron beam so as to generate a programmed pattern; and
   deflecting the scanned beam such that the scanned beam impinges telecentrically upon a surface of a target substrate,
   wherein said deflecting is performed using a Wien filter elongated and oriented lengthwise along the first dimension, and
   wherein the elongated Wien filter comprises an electric comb deflector applying an electric field along the first dimension and a static magnetic deflector applying a magnetic field perpendicular to the first dimension.

\* \* \* \* \*